United States Patent [19]

Peters et al.

[11] Patent Number: 5,766,650
[45] Date of Patent: Jun. 16, 1998

[54] MOULDING APPARATUS WITH COMPENSATION ELEMENT

[75] Inventors: Gerardus Franciscus Wilhelmus Peters, Loo; Hendrikus Johannus Beernardus Peters, Didam, both of Netherlands

[73] Assignee: Fico B.V., Didam, Netherlands

[21] Appl. No.: 598,000

[22] Filed: Feb. 7, 1996

[30] Foreign Application Priority Data

Feb. 9, 1995 [NL] Netherlands ............... 95.00238

[51] Int. Cl.$^6$ .............. B29C 45/02; B29C 45/14
[52] U.S. Cl. .......... 425/116; 425/117; 425/129.1; 425/190; 425/544; 249/93; 249/95; 264/278
[58] Field of Search .................. 425/116, 129.1, 425/117, 544, 588, 572, DIG. 228, 190; 264/272.17, 275, 278; 249/93, 91, 95

[56] References Cited

U.S. PATENT DOCUMENTS

| 4,044,984 | 8/1977 | Shimizu et al. | 425/116 |
|---|---|---|---|
| 4,332,537 | 6/1982 | Slepcevic | 249/95 |
| 4,442,056 | 4/1984 | Slepcevic | 264/272.17 |
| 4,470,786 | 9/1984 | Sano et al. | 425/116 |
| 4,779,835 | 10/1988 | Fukushima et al. | 425/116 |
| 5,118,271 | 6/1992 | Baird et al. | 425/116 |
| 5,484,274 | 1/1996 | Neu | 425/116 |

FOREIGN PATENT DOCUMENTS

| 4179130 | 6/1992 | Japan . |
|---|---|---|
| 5218508 | 8/1993 | Japan . |
| 671685 | 3/1994 | Japan . |

*Primary Examiner*—Khanh P. Nguyen
*Attorney, Agent, or Firm*—Webb Ziesenheim Bruening Logsdon Orkin & Hanson, P.C.

[57] ABSTRACT

The invention relates to a moulding apparatus for moulding a chip on a flat carrier, including a mould formed by two mould parts which are movable relative to each other and between which the carrier can be received, the one mould part of which is provided with a mould cavity against the peripheral edges of which the carrier can be pressed, and means for exerting pressure in at least one cavity for moulding material arranged in the mould and connected to the mould cavity by means of a runner, wherein at least one compensation element is arranged whereby in the closed position of the mould parts one side of the carrier is held sealingly against the peripheral edge of the mould cavity.

7 Claims, 4 Drawing Sheets

5,766,650

MOULDING APPARATUS WITH COMPENSATION ELEMENT

BACKGROUND OF THE INVENTION

1. Field of the Invention

The invention relates to a moulding apparatus for moulding a chip on a flat carrier, including a mould formed by two mould parts movable relative to each other between which the carrier can be received, the one mould part of which is provided with a mould cavity against the peripheral edges of which the carrier can be pressed, and means for exerting pressure in at least one cavity for moulding material arranged in the mould and connected to the mould cavity by means of a runner.

2. Description of the Prior Art

Such moulding apparatus are used on a large scale for protecting chips placed on a carrier. Through being encapsulated the chip is protected against for instance moisture and mechanical damage. Otherwise than in a normal injection moulding process, a separate element must be placed in the mould for injection moulding. This separate element consists herein of the carrier with chip fixed thereon. For accurate moulding it is herein required that the carrier with chip fixed thereon is fixedly clamped by the mould parts during the moulding operation. The dimensions of the carrier usually fall accurately within determined limits, to which the mould parts are adapted for precise fitting. It is a problem however to process carriers with a chip fixed thereon where the dimensions are not precisely known in advance. The danger can thus occur for instance that when the carriers are too thin, leakages occur and that when the carriers are too thick, they are damaged by excessive clamping forces. This problem occurs particularly in the processing of carriers in the form of a printed circuit board (for instance for so-called "ball grid array boards").

SUMMARY OF THE INVENTION

The present invention has for its object to provide a moulding apparatus for moulding a chip on a flat carrier with which variations in the thickness of the carrier can be compensated.

The invention provides for this purpose a moulding apparatus of the type stated in the background, wherein at least one compensation element is arranged, whereby in the closed position of the mould parts one side of the carrier is held sealingly against the peripheral edge of the mould cavity. Use of this moulding apparatus enables processing of carriers of varying thickness. It hereby becomes possible not only to use less expensive carriers but also to use carriers of a material with a relatively great thickness toleration. This makes it possible for example to use printed circuit board material as carriers.

In a preferred embodiment the mould parts are urged against each other in the closed position under a predetermined force. In this embodiment it is possible to form the cavity for moulding material with the two mutually connecting mould parts. This simplifies the construction of the mould parts and also makes it comparatively simple to introduce moulding material into the mould.

The compensation element preferably lies on the side of the carrier remote from the mould cavity. The compensation element will herein lie at a distance from the feed runner for moulding material whereby no interaction will occur between the two.

Another preferred embodiment is characterized in that at least one mould part comprises a number of segments which are movable relative to each other and which are mutually connected with interposing of at least one spring. The gas-powered, hydraulic or mechanical spring preferably has an adjustable spring force. In all these preferred embodiments the spring forms the compensation element whereby the carrier is held sealingly against the peripheral edge of the mould cavity. The advantage of an adjustable spring is that the force with which the carrier is held against the peripheral edge of the mould cavity is adjustable.

Yet another embodiment is characterized in that at least one mould part comprises a number of segments which are movable relative to each other and which are mutually connected with interposing of at least one clamping device. A clamping device is used here as compensation element instead of a spring. An example of such a clamping device is for example a slidable wedge; wherein a segment of a mould part is displaceable by sliding the wedge. In this manner the position of the segment can be changed and it is also possible to exert a desired pressure with the segment, for instance on a carrier.

An entirely different preferred embodiment of the invention is characterized in that the compensation element is an elastic strip. This elastic strip can be fixed to the contact side of the mould part, but can also be connected to the carrier. It is also possible to arrange the elastic strip as a separate element between carrier and mould part. A variant hereof is that the compensation element is a spring ring.

BRIEF DESCRIPTION OF THE DRAWING

The present invention will be further elucidated with reference to the non-limitative embodiments shown in the following figures. Herein.

DESCRIPTION OF THE PREFERRED EMBODIMENT

Figure 1:
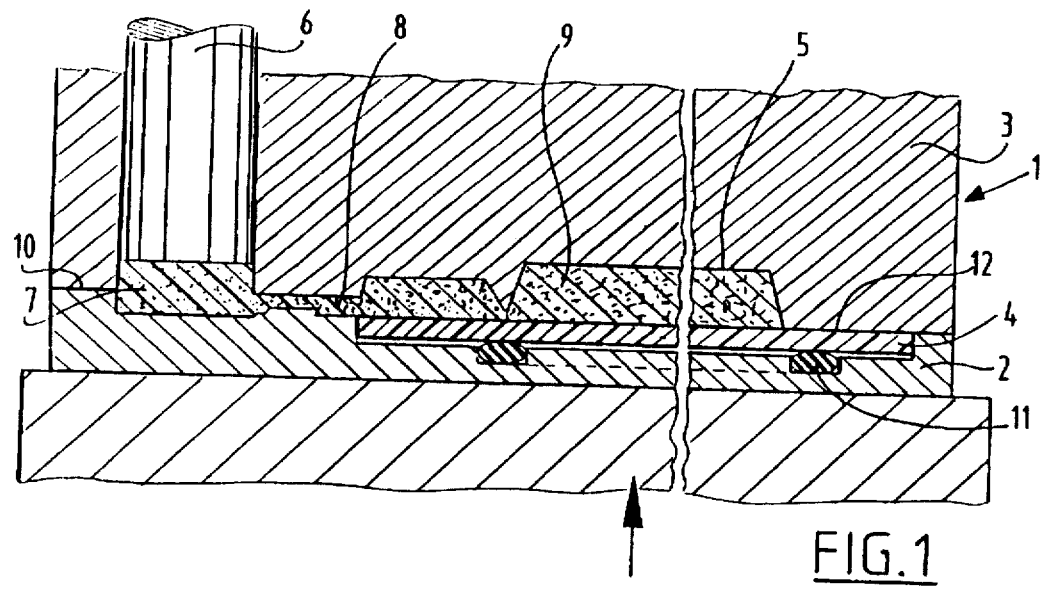
FIG. 1 shows a schematic cross-section of a moulding apparatus with spring ring according to the invention in the operational situation.

FIG. 1 shows a moulding apparatus 1 in which a carrier 4 is received between two mould parts 2, 3, on which carrier is arranged a chip for moulding (not shown in this figure). In the upper mould part 3 is arranged a mould cavity 5 in which a covering element 9 can be arranged through a runner 8 by exerting pressure on moulding material 7 using a plunger 6. In order to prevent moulding material 7 leaking to the outside at a parting 10 between the mould parts 2, 3, the mould halves 2, 3 must connect together precisely. For this purpose the mould parts 2, 3 are pressed against each other with a predetermined force F. To now also ensure that the carrier 4 is enclosed non-movably between the mould parts 2, 3, i.e irrespective of differences in thickness of the carrier 4, a compensation element in the form of a spring ring 11 is arranged in the lower mould part 2. This spring ring 11 presses the carrier 4 against a peripheral edge 12 of the upper mould part 3.

Figure 2:
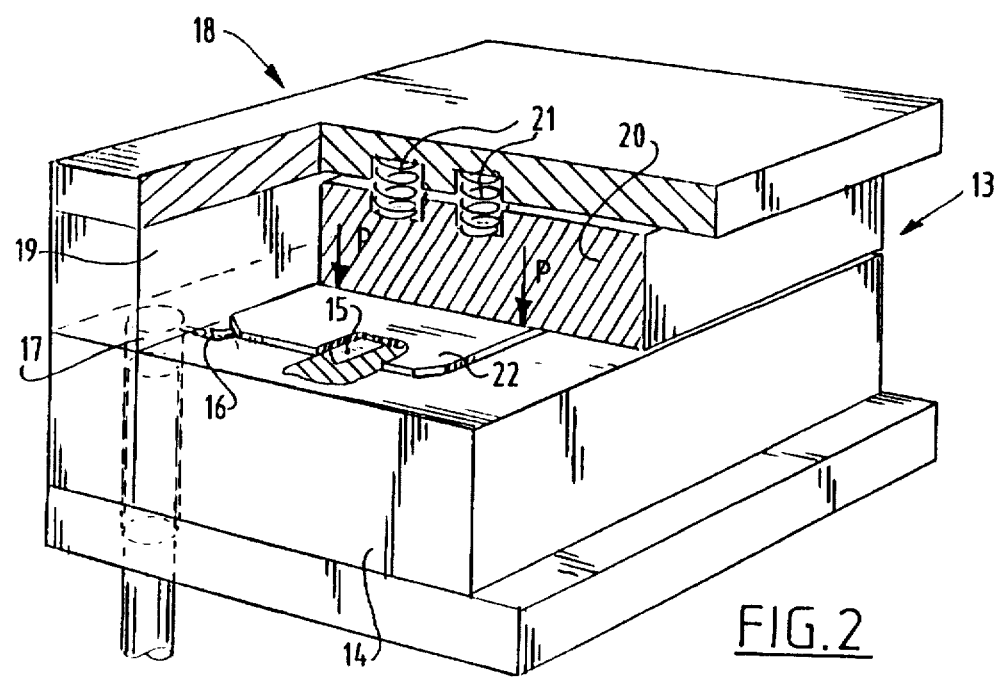
FIG. 2 shows a partly cut away perspective view of a moulding apparatus with a segment supported by springs as according to the invention.

FIG. 2 shows an alternative moulding apparatus 13 in which a lower mould part 14 is provided with a mould cavity 15 and, communicating therewith, a runner 16 which is then connected to a supply device 17 for moulding material. An upper mould part 18 comprises two segments 19, 20 movable relative to each other. The segments 19, 20 are mutually connected with interposing of springs 21. The mould parts 14, 18 close precisely onto each other close to the supply device 17 irrespective of the thickness of a carrier 22. The force exerted on the carrier 22 by the segment 20 as according to arrows P depends on the spring constants of the springs 21. The springs 21 thus determine with what force the carrier 22 is pressed against the lower mould part 14, without this having to depend on the thickness of the carrier 22, wherein the thickness of the carrier 22 also has no influence on the connection of the mould parts 14, 18 close to the supply device 17 for moulding material.

Figure 3:
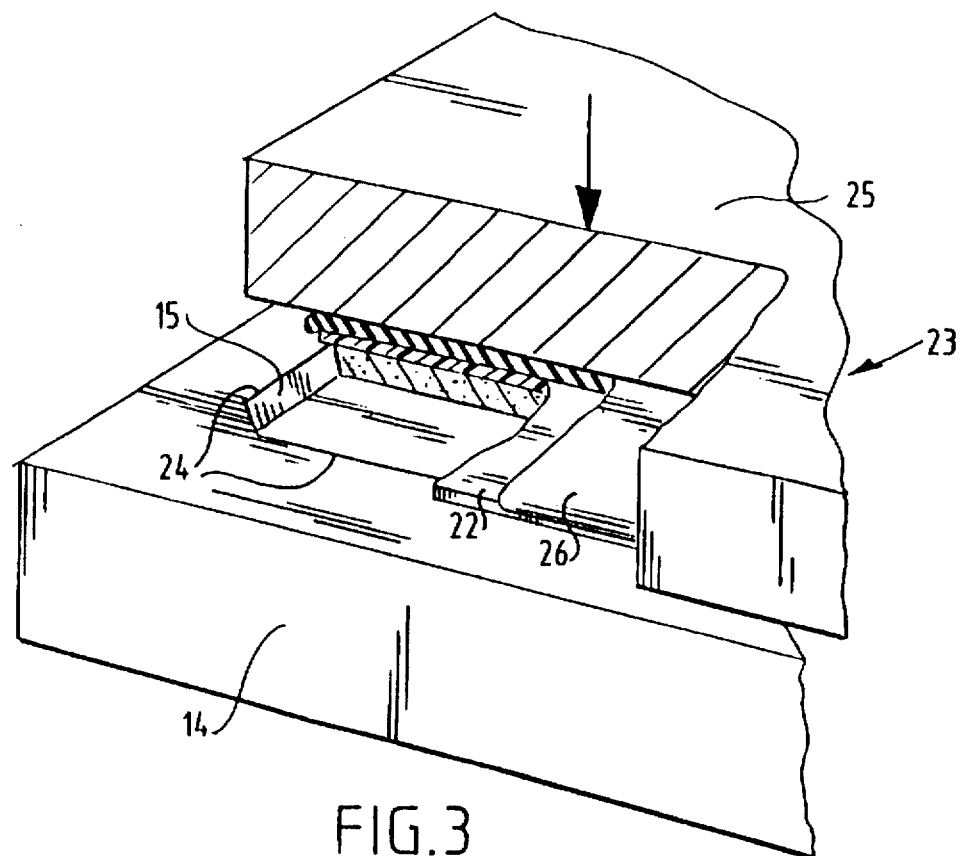
FIG. 3 shows a partly cut away perspective view of a moulding apparatus with an elastic strip.

FIG. 3 shows a moulding apparatus 23, wherein as according to the previous figure a mould cavity 15 is arranged in the lower mould part 14, against the peripheral edges 24 of which cavity is pressed a carrier 22. Between the carrier 22 and an upper mould part 25 a layer of resilient material 26 is arranged. The layer of resilient material 26 herein forms the above mentioned compensation element for differences in thickness of the carrier 22. The layer of resilient material 26 can therein be fixedly connected to the upper mould part 25, can be arranged separately between the carrier 22 and the upper mould part 25 or can be fixed to the carrier 22 as shown in FIG. 4.

Figure 4:
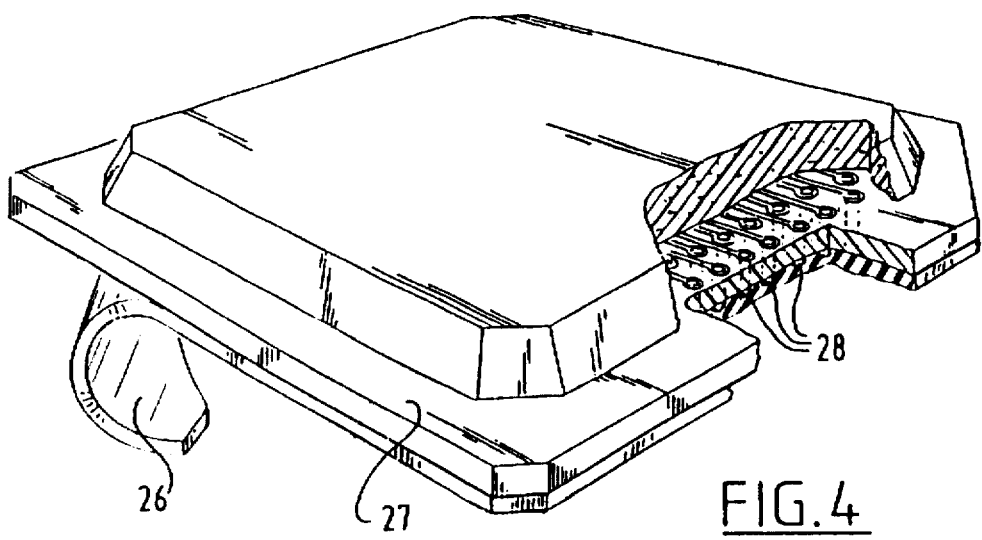
FIG. 4 shows a partly cut away perspective view of a carrier with moulded chip to which is fixed an elastic strip.

A carrier 27 shown in FIG. 4 is provided on the side remote from the chip for moulding with a releasable layer of resilient material 26. The layer of resilient material 26 must be removable after the moulding operation since the layer 26 covers contact points 28 which are of great importance for later operation of the moulded chip. An additional advantage of this embodiment is that the contact points 28 are protected by the layer of resilient material 26 during the moulding operation.

Figure 5:
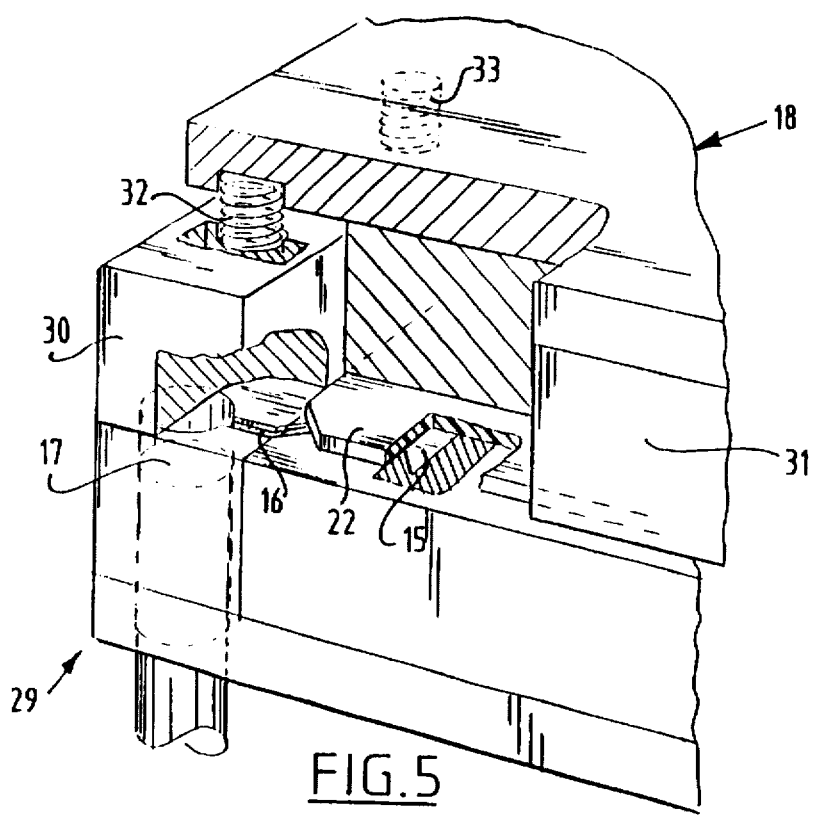
FIG. 5 shows a partly cut away perspective view of an alternative to the moulding apparatus shown in FIG. 1.

FIG. 5 shows a moulding apparatus 29 similar to the moulding apparatus 13 shown in FIG. 2, wherein the upper mould part 18 comprises a number of segments 30, 31 which are all connected to a central holding plate 34 with interposing of springs 32, 33.

Figure 6:
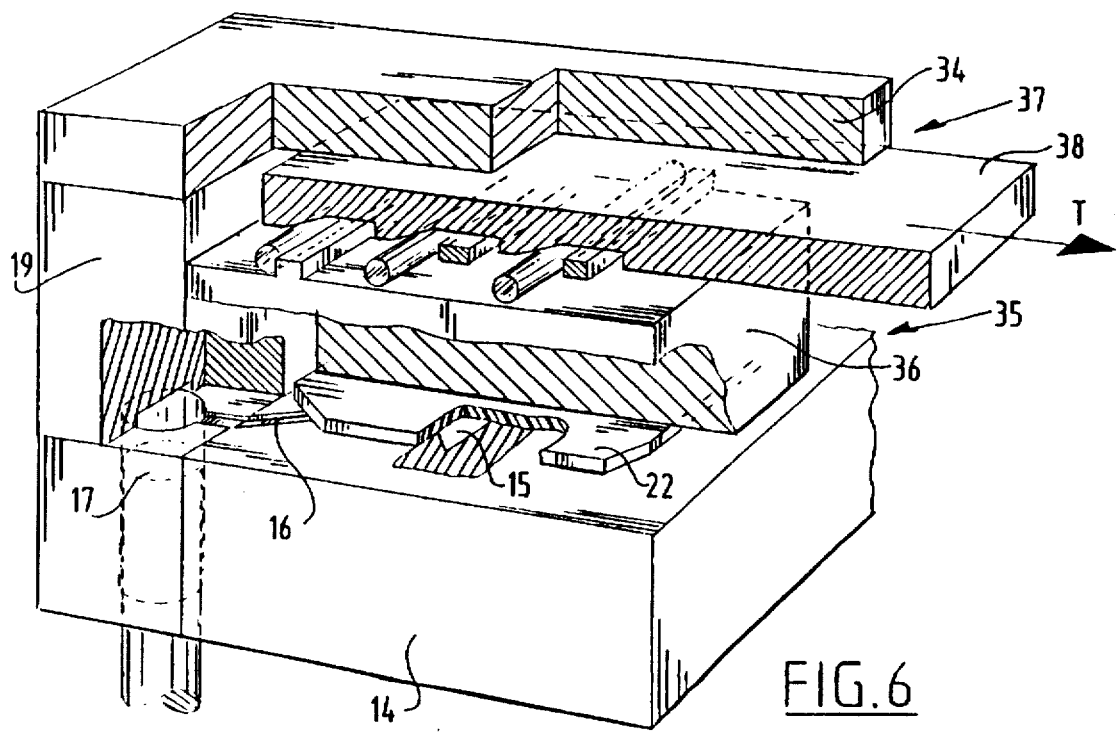
FIG. 6 shows a partly cut away perspective view of a moulding apparatus with clamping device.

FIG. 6 shows a moulding apparatus 35, of which a segment 36 is connected to a holding plate 34 with interposing of a clamping device 37. The segment 36 is urged further downward relative to holding plate 34 by displacing a beam 38 as according to arrow T. Depending on the force exerted in the direction of arrow T, it is possible to vary the force which segment 36 exerts on carrier 22. The embodiment of the beam 38 shown here has of course many alternatives. A wedge-shaped element can be envisaged here for instance. With this preferred embodiment it is also possible to move mould part 14 and segment 19 to within a short distance of each other in order to effect the definitive connection of segment 19 to mould part 14 after the segment 36 has already been brought into contact with carrier 22.

Figure 7:
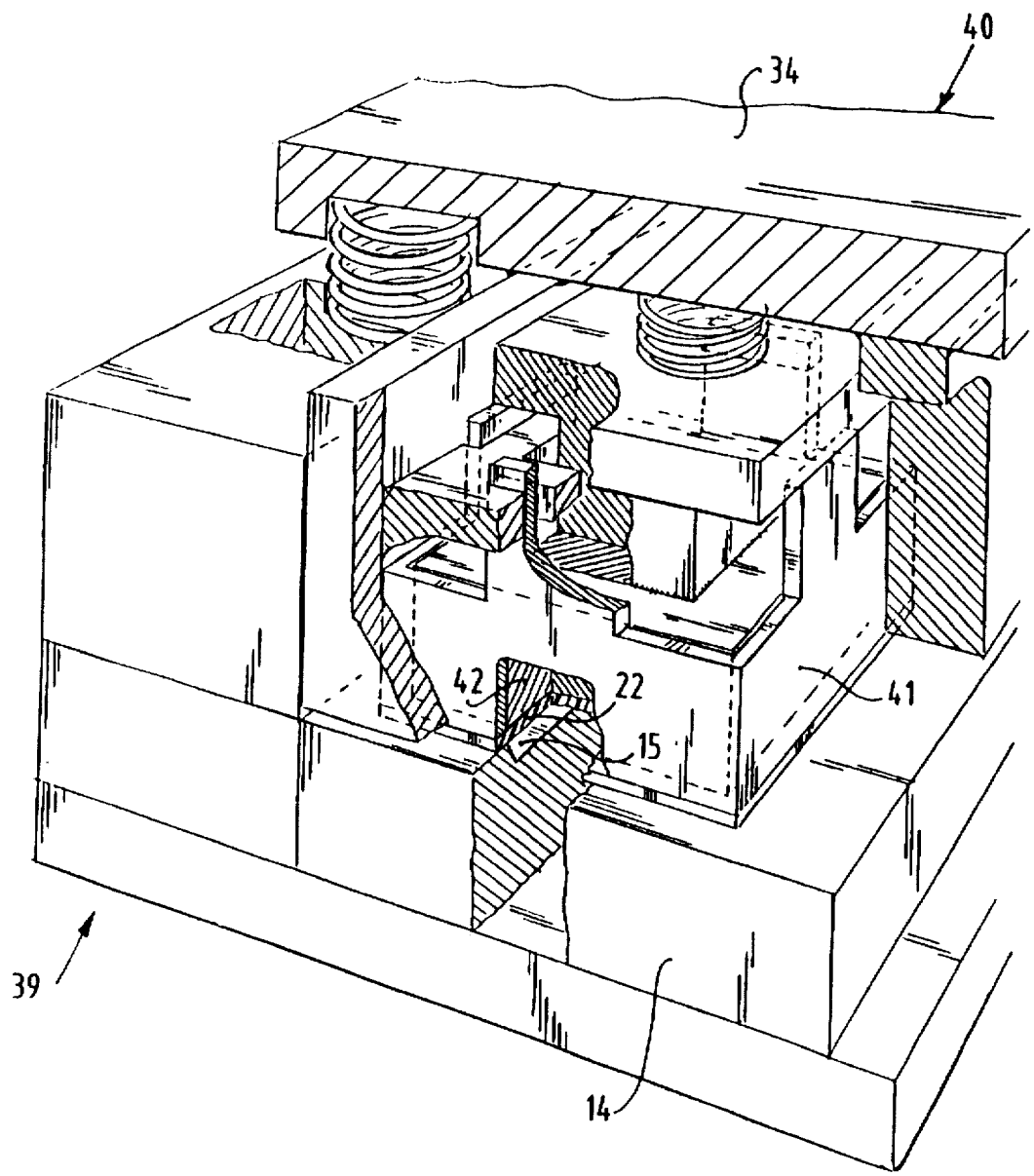
FIG. 7 shows a moulding apparatus with compensation element in the form of a profile part.

FIG. 7 finally shows a moulding apparatus 39 wherein a segment 40 forms part of an upper mould part 41. The segment 40 has a form such that it only engages the carrier 22 along one edge. This prevents the clamping force on the edge of the carrier 22 becoming too great in the case of a relatively thick carrier 22. A middle segment 42 fixedly connected to holding plate 34 exerts a pressure which is not dependent on the thickness of carrier 22. However, in the region where the middle segment 42 exerts pressure on carrier 22 the latter is less sensitive and can thus withstand a greater clamping force here. The advantage of this embodiment is that the pressure exerted by the moulding material has less influence on the pressure exerted by the segment 40.

We claim:

1. A moulding apparatus for moulding a chip on a flat carrier, comprising:

a mould formed by two mould parts which are movable relative to each other and between which the carrier can be received, one of said mould parts being provided with a mould cavity against the peripheral edges of which the carrier can be pressed; and means for exerting pressure in at least one cavity for moulding material arranged in the mould and connected to the mould cavity by a runner, wherein at least one compensation element is arranged whereby in a closed position of the two mould parts one side of the carrier is held sealingly against the peripheral edge of the mould cavity, and wherein the at least one compensation element comprises a holding plate fixedly attached to the moulding apparatus, a displaceable beam having wedge-shaped elements interposed between the holding plate and the carrier and a mould segment interposed between the beam and the carrier such that displacement of the beam varies a force which the segment exerts upon the carrier.

2. The moulding apparatus as claimed in claim 1, wherein said two mould parts are urged against each other under a predetermined force when said two mould parts are in the closed position.

3. The moulding apparatus as claimed in claim 1 wherein said compensation element lies on a side of the carrier remote from the mould cavity.

4. The moulding apparatus as claimed in claim 1, wherein at least one mould part includes a number of segments which are movable relative to each other.

5. The moulding apparatus as claimed in claim 3, wherein at least one mould part includes a number of segments which are movable relative to each other.

6. The moulding apparatus as claimed in claim 1, wherein rollers abut the wedge-shaped elements such that displacement of the beam causes the variation of the force which the segment exerts upon the carrier.

7. The moulding apparatus as claimed in claim 1, wherein the carrier is a ball grid array board.

\* \* \* \* \*